(12) United States Patent
Lee et al.

(10) Patent No.: US 10,943,903 B2
(45) Date of Patent: Mar. 9, 2021

(54) ASYMMETRIC THRESHOLD VOLTAGE VTFET WITH INTRINSIC DUAL CHANNEL EPITAXY

(71) Applicant: INTERNATIONAL BUSINESS MACHINES CORPORATION, Armonk, NY (US)

(72) Inventors: Choonghyun Lee, Rensselaer, NY (US); Jingyun Zhang, Albany, NY (US); Takashi Ando, Tuckahoe, NY (US); Alexander Reznicek, Troy, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/590,976

(22) Filed: Oct. 2, 2019

(65) Prior Publication Data

US 2020/0111788 A1 Apr. 9, 2020

Related U.S. Application Data

(62) Division of application No. 16/153,293, filed on Oct. 5, 2018, now Pat. No. 10,529,716.

(51) Int. Cl.
*H01L 27/092* (2006.01)
*H01L 21/8238* (2006.01)
(Continued)

(52) U.S. Cl.
CPC .... *H01L 27/0922* (2013.01); *H01L 21/02532* (2013.01); *H01L 21/28088* (2013.01);
(Continued)

(58) Field of Classification Search
CPC ....... H01L 21/823885; H01L 21/28088; H01L 21/823814; H01L 29/4966
See application file for complete search history.

(56) References Cited

U.S. PATENT DOCUMENTS 7,183,152 B1 2/2007 Dakshina-Murthy et al.
7,504,693 B2 3/2009 Zhu et al.
(Continued)

OTHER PUBLICATIONS

Baek et al., "Device Optimization of N-Channel MOSFETs with Lateral Asymmetric Channel Doping Profiles", Transactions on Electrical and Electronic Materials, vol. 11, No. 1. Feb. 25, 2010. pp. 15-19.

(Continued)

*Primary Examiner* — Amar Movva
(74) *Attorney, Agent, or Firm* — Tutunjian & Bitetto, P.C.; Jeffrey S. LaBaw (57) ABSTRACT

A method is presented for triggering asymmetric threshold voltage along a channel of a vertical transport field effect transistor (VTFET). The method includes constructing a first set fins from a first material, constructing a second set of fins from a second material, forming a source region between the first set of fins, and forming a drain region between the second set of fins, the source region composed of a different material than the drain region. The method further includes depositing a first high-k metal gate over the first set of fins and depositing a second high-k metal gate over the second set of fins, the second high-k metal gate being different than the first high-k metal gate such that the asymmetric threshold voltage is present along the channel of the VTFET in a region defined at the bottom of the first and second set of fins.

20 Claims, 9 Drawing Sheets

(51) Int. Cl.

| | | |
|---|---|---|
| *H01L 29/165* | (2006.01) | |
| *H01L 21/02* | (2006.01) | |
| *H01L 21/28* | (2006.01) | |
| *H01L 29/167* | (2006.01) | |
| *H01L 29/08* | (2006.01) | |
| *H01L 29/78* | (2006.01) | |
| *H01L 29/10* | (2006.01) | |
| *H01L 29/49* | (2006.01) | |
| *H01L 21/3065* | (2006.01) | |
| *H01L 21/306* | (2006.01) | |
| *H01L 21/308* | (2006.01) | |
| *H01L 21/3105* | (2006.01) | |
| *H01L 21/321* | (2006.01) | |
| *H01L 21/324* | (2006.01) | |

(52) U.S. Cl.
CPC ........ *H01L 21/823814* (2013.01); *H01L 21/823842* (2013.01); *H01L 21/823864* (2013.01); *H01L 21/823878* (2013.01); *H01L 21/823885* (2013.01); *H01L 29/0847* (2013.01); *H01L 29/1037* (2013.01); *H01L 29/165* (2013.01); *H01L 29/167* (2013.01); *H01L 29/7827* (2013.01); *H01L 21/0217* (2013.01); *H01L 21/0228* (2013.01); *H01L 21/02164* (2013.01); *H01L 21/02181* (2013.01); *H01L 21/02271* (2013.01); *H01L 21/02609* (2013.01); *H01L 21/3065* (2013.01); *H01L 21/3081* (2013.01); *H01L 21/3086* (2013.01); *H01L 21/30604* (2013.01); *H01L 21/31053* (2013.01); *H01L 21/324* (2013.01); *H01L 21/3212* (2013.01); *H01L 29/4966* (2013.01)

(56) References Cited

U.S. PATENT DOCUMENTS

| | | |
|---|---|---|
| 7,560,328 B2 | 7/2009 | Chidambarroa et al. |
| 8,237,197 B2 | 8/2012 | Chen et al. |
| 8,476,706 B1 | 7/2013 | Chidambarrao et al. |
| 8,513,081 B2 | 8/2013 | Guo et al. |
| 9,263,346 B2 | 2/2016 | Tsunomura et al. |
| 2018/0005896 A1 | 1/2018 | Mallela et al. |

OTHER PUBLICATIONS

Narasimhulu et al., "Impact of Lateral Asymmetric Channel Doping on Deep Submicrometer Mixed-Signal Device and Circuit Performance", IEEE Transactions on Electron Devices. vol. 50, No. 12. Dec. 2003. pp. 2481-2489.

List of IBM Patents or Patent Applications Treated as Related dated Oct. 2, 2019, 2 pages.

ASYMMETRIC THRESHOLD VOLTAGE VTFET WITH INTRINSIC DUAL CHANNEL EPITAXY

BACKGROUND

Technical Field

The present invention relates generally to semiconductor devices, and more specifically, to forming an asymmetric threshold voltage vertical transport field effect transistor (VTFET) with intrinsic dual channel epitaxy.

Description of the Related Art

In recent years, with increases in the degree of integration, functionality, and speed of semiconductor devices, there is an increasing demand for miniaturization of semiconductor devices. To meet the demand, various device structures have been proposed for reducing an area occupied by transistors over a substrate. Among them, a field effect transistor (FET) having a fin-type structure (FinFET) has drawn attention. FinFETs are three-dimensional structures that rise above the substrate and resemble a fin. It is desirable to have improvements in the fabrication of FinFET transistors to improve quality of transistor contacts.

SUMMARY

In accordance with an embodiment, a method is provided for triggering asymmetric threshold voltage along a channel of a vertical transport field effect transistor (VTFET). The method includes constructing a first set fins from a first material, constructing a second set of fins from a second material, forming a source region between the first set of fins, forming a drain region between the second set of fins, the source region composed of a different material than the drain region, depositing a first high-k metal gate over the first set of fins, and depositing a second high-k metal gate over the second set of fins, the second high-k metal gate being different than the first high-k metal gate such that the asymmetric threshold voltage is present along the channel of the VTFET in a region defined at the bottom of the first and second set of fins.

In accordance with another embodiment, a method is provided for triggering asymmetric threshold voltage along a channel of a vertical transport field effect transistor (VTFET). The method includes forming constructing a plurality of carbon doped silicon (Si:C) fins over a substrate, constructing a plurality of silicon germanium (SiGe) fins over the substrate, forming a silicon doped with phosphorous (Si:P) source region between the plurality of Si:C fins, forming a silicon germanium doped with boron (SiGe:B) drain region between the plurality of SiGe fins, employing a shallow trench isolation (STI) region to separate the Si:P source region from the SiGe:B drain region, depositing a first high-k metal gate over the plurality of Si:C fins, and depositing a second high-k metal gate over the plurality of SiGe fins such that the asymmetric threshold voltage is present along the channel of the VTFET in a region defined at the bottom of the plurality of Si:C fins and at the bottom of the plurality of SiGe fins.

In accordance with yet another embodiment, a semiconductor structure is provided for triggering asymmetric threshold voltage along a channel of a vertical transport field effect transistor (VTFET). The semiconductor structure includes a first set fins constructed from a first material, a second set of fins constructed from a second material, a source region disposed between the first set of fins, a drain region disposed between the second set of fins, the source region composed of a different material than the drain region, a first high-k metal gate disposed over the first set of fins, and a second high-k metal gate disposed over the second set of fins, the second high-k metal gate being different than the first high-k metal gate such that the asymmetric threshold voltage is present along the channel of the VTFET in a region defined at the bottom of the first and second set of fins.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming an asymmetric threshold voltage vertical transport field effect transistor (VTFET) with intrinsic dual channel epitaxy. Vertical FET devices employ doped source and drain regions, where a doped source/drain region for a vertical FET can be formed on top of a vertical semiconductor fin, and where a doped source/drain region can be formed underneath the vertical semiconductor fin. In addition, a vertical source/drain (S/D) contact of the vertical FET device can be disposed adjacent to the vertical semiconductor fin as an elongated bar contact. The vertical S/D contact can be formed to make contact to an upper surface of the underlying S/D region, and can be disposed at a sufficient distance from the vertical semiconductor fin so that the vertical S/D contact does not electrically short to the vertical metal gate structure formed on the vertical semiconductor fin. What this effectively means is that the current path through the doped S/D region between a vertical contact/S/D region interface and a S/D region/ channel junction interface, can be constructed entirely of doped semiconductor material. This current path through the doped S/D region, if relatively long, can result in increased series resistance of the S/D, which in turn reduces a total drive current of the vertical FET device.

Embodiments in accordance with the present invention provide methods and devices employing techniques for fabricating or constructing vertical transport field effect transistor (VTFETs) having a gradient threshold voltage, which improves device performance due to the enhancement of the electric field. The gradient threshold voltage of the VTFETs in the exemplary embodiments of the present invention can be achieved by a dual channel configuration. For n-type field effect transistor (nFET) threshold voltage control, carbon can be employed to decrease the threshold voltage, whereas for p-type field effect transistor (pFET) threshold voltage control, germanium can be used in the channel. Thus, asymmetric threshold voltage along the channel can be achieved by channel engineering involving carbon doped silicon (Si:C) incorporation for an nFET and silicon germanium (SiGe) incorporation for a pFET. A steep potential distribution near the source side enhances the lateral channel electric field and thus increases carrier mobility.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
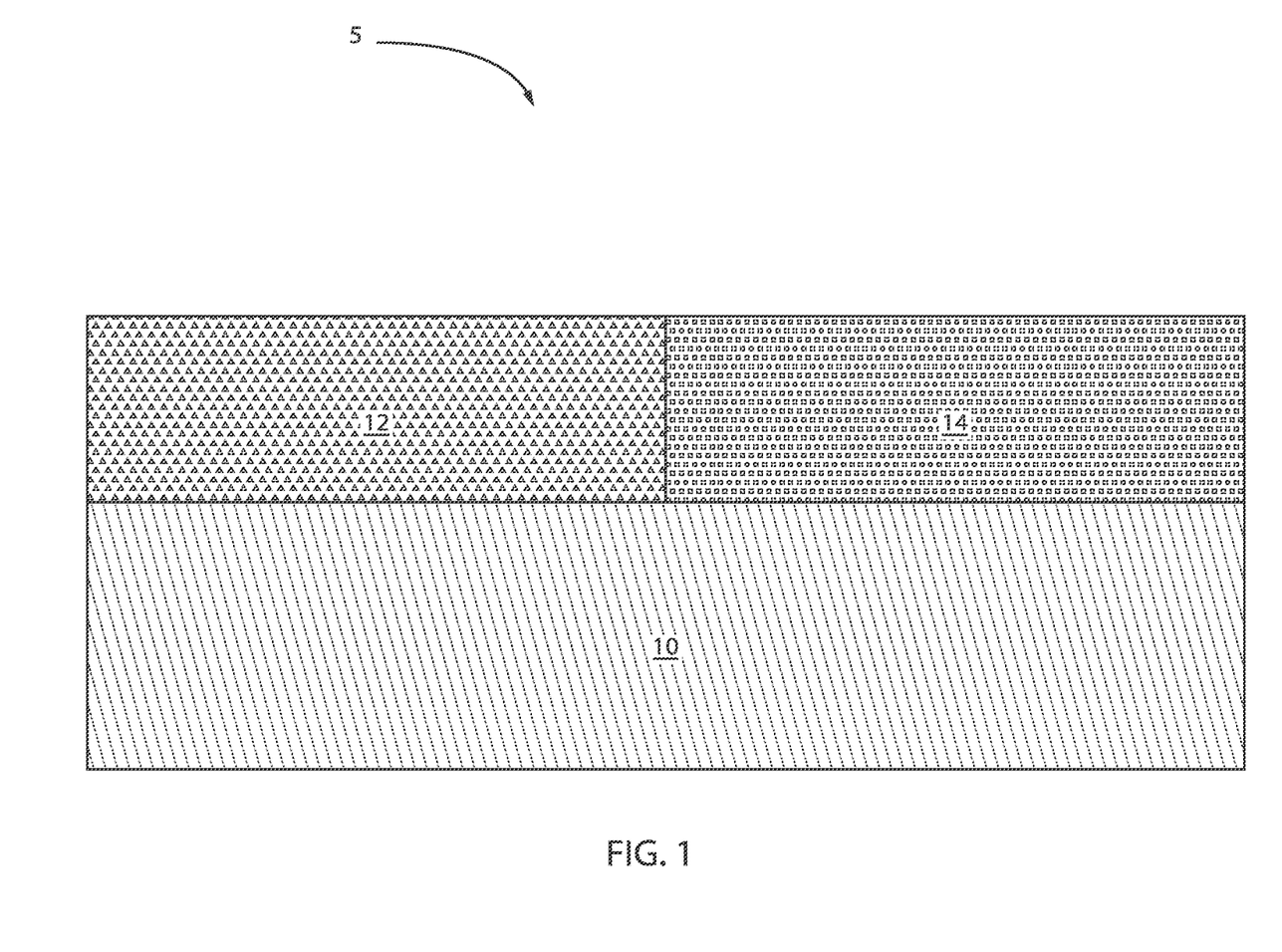
FIG. 1 is a cross-sectional view of a semiconductor structure including channel epi over a semiconductor substrate, in accordance with an embodiment of the present invention.

FIG. 1 is a cross-sectional view of a semiconductor structure including channel epi over a semiconductor substrate, in accordance with an embodiment of the present invention.

In various exemplary embodiments, a semiconductor structure 5 is depicted where a first material 12 and a second material 14 are epitaxially grown over a semiconductor substrate 10. The first material 12 can be, e.g., carbon doped silicon (Si:C) and the second material 14 can be, e.g., silicon germanium (SiGe). The carbon (C) and germanium (Ge) concentrations are low enough to avoid any defects.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

Figure 2:
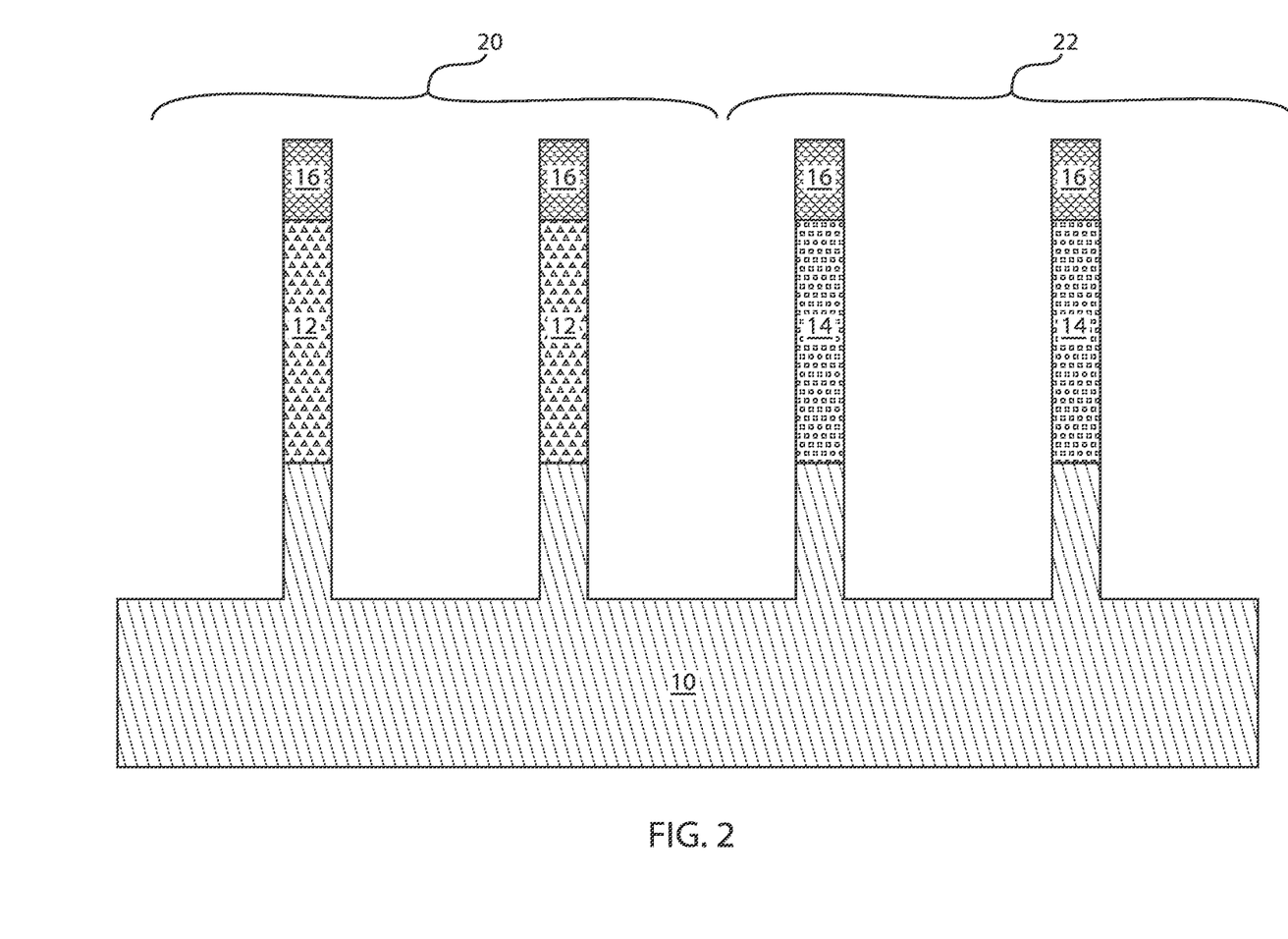
FIG. 2 is a cross-sectional view of the semiconductor structure of FIG. 1 where a plurality of fins are formed over the semiconductor substrate, in accordance with an embodiment of the present invention.

FIG. 2 is a cross-sectional view of the semiconductor structure of FIG. 1 where a plurality of fins are formed over the semiconductor substrate, in accordance with an embodiment of the present invention.

In various exemplary embodiments, the first material 12 and the second material 14 are etched to form a plurality of fins 12, 14. A first set of fins 12 are formed from Si:C, whereas a second set of fins 14 are formed from SiGe. A hardmask 16 is formed over the first set of fins 12 and over the second set of fins 14. The first set of fins 12 will enable the formation of an n-type field effect transistor (nFET) device in an nFET region 20 and the second set of fins 14 will enable the formation of a p-type field effect transistor (pFET) device in a pFET region 22.

The plurality of fins 12, 14 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The plurality of fins 12, 14 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

The hardmask 16 can be manufactured of silicon nitride (SiN), deposited using, for example, low pressure chemical vapor deposition (LPCVD). In other example embodiments, the hardmask 16 can include, but is not limited to, hafnium oxide (HfO$_2$) or tantalum nitride (TaN) or titanium nitride (TiN). In some embodiments, the hardmask 16 can include multiple layers, for example, silicon nitride on top of silicon oxide. In some embodiments, the vertical thickness of the hardmask 16 ranges from about 30 nm to about 150 nm. The hardmask 16 can be formed by any suitable patterning technique, including but not limited to, sidewall image transfer (SIT), self-aligned double patterning (SADP), self-aligned quadruple patterning (SAQP), lithography followed by etching, etc.

Figure 3:
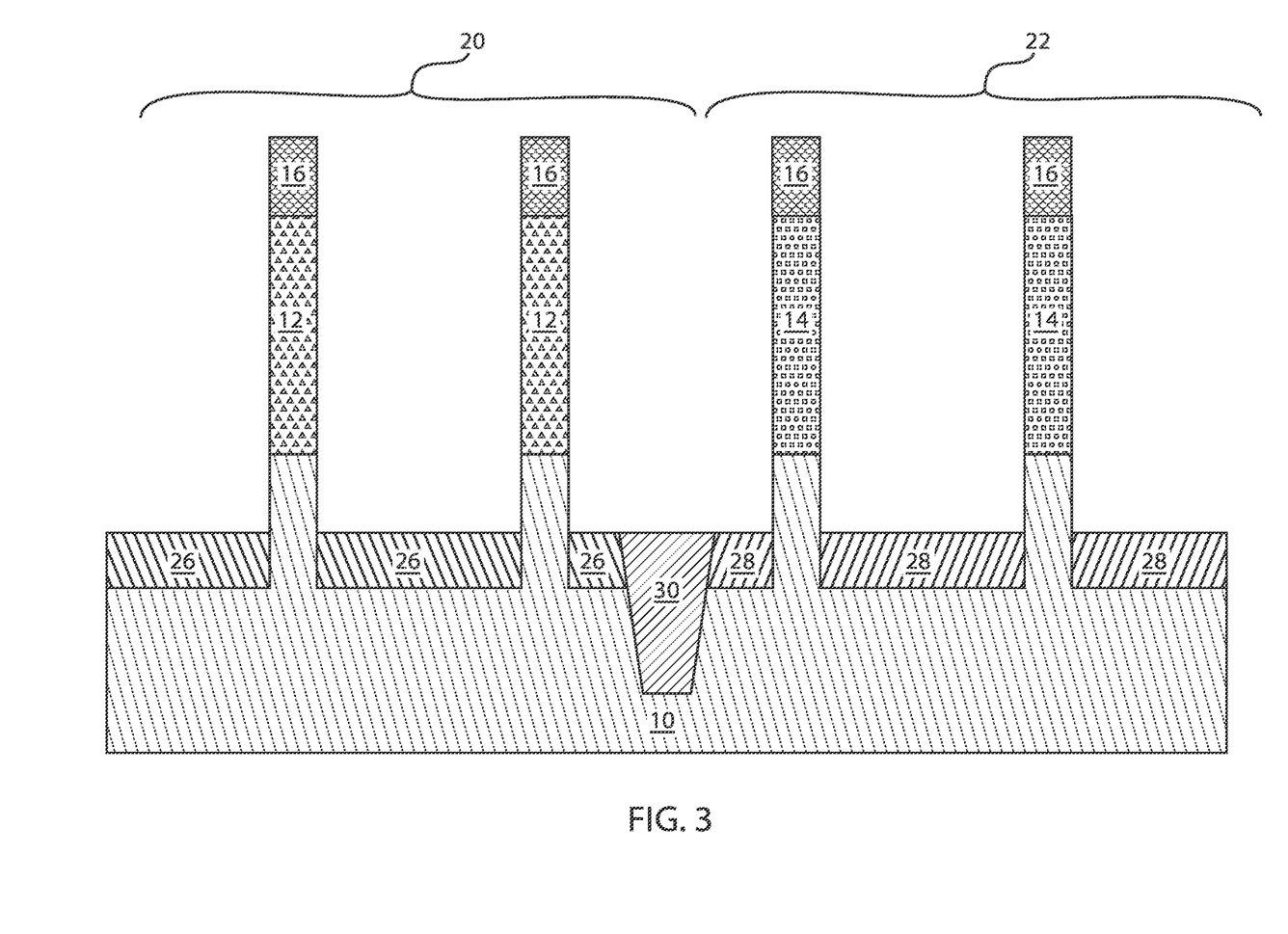
FIG. 3 is a cross-sectional view of the semiconductor structure of FIG. 2 where bottom source/drain regions are formed, in accordance with an embodiment of the present invention.

FIG. 3 is a cross-sectional view of the semiconductor structure of FIG. 2 where bottom source/drain regions are formed, in accordance with an embodiment of the present invention.

In various exemplary embodiments, bottom source/drain regions 26, 28 are formed. The source/drain regions 26 can be formed in the nFET region 20 and source/drain regions 28 can be formed in the pFET region 22. Additionally, a shallow trench isolation (STI) region 30 can be formed between the nFET region 20 and the pFET region 22. The STI region 30 can separate the source/drain region 26 of the nFET from the source/drain region 28 of the pFET.

Bottom source/drain regions 26, 28 can be epitaxially grown over the substrate 10. Source/drain regions 26, 28 can be, e.g., Si:P for an nFET (nFET region 20) and SiGe:B for a pFET (pFET region 22). It is to be understood that the term "source/drain region" as used herein means that a given source/drain region can be either a source region or a drain region, depending on the application. In one exemplary embodiment, the source 26 is formed between the Si:C fins 12 in the nFET region 20 and the drain 28 is formed between the SiGe fins 14 in the pFET region 22.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Shallow trench isolation (STI) structure 30 is formed in the substrate 10 to electrically isolate regions of adjacent semiconductor devices that are formed over the substrate 10. STI structure 30 can include oxide (STI oxide), and STI structure 30 can have a corresponding STI step height.

Figure 4:
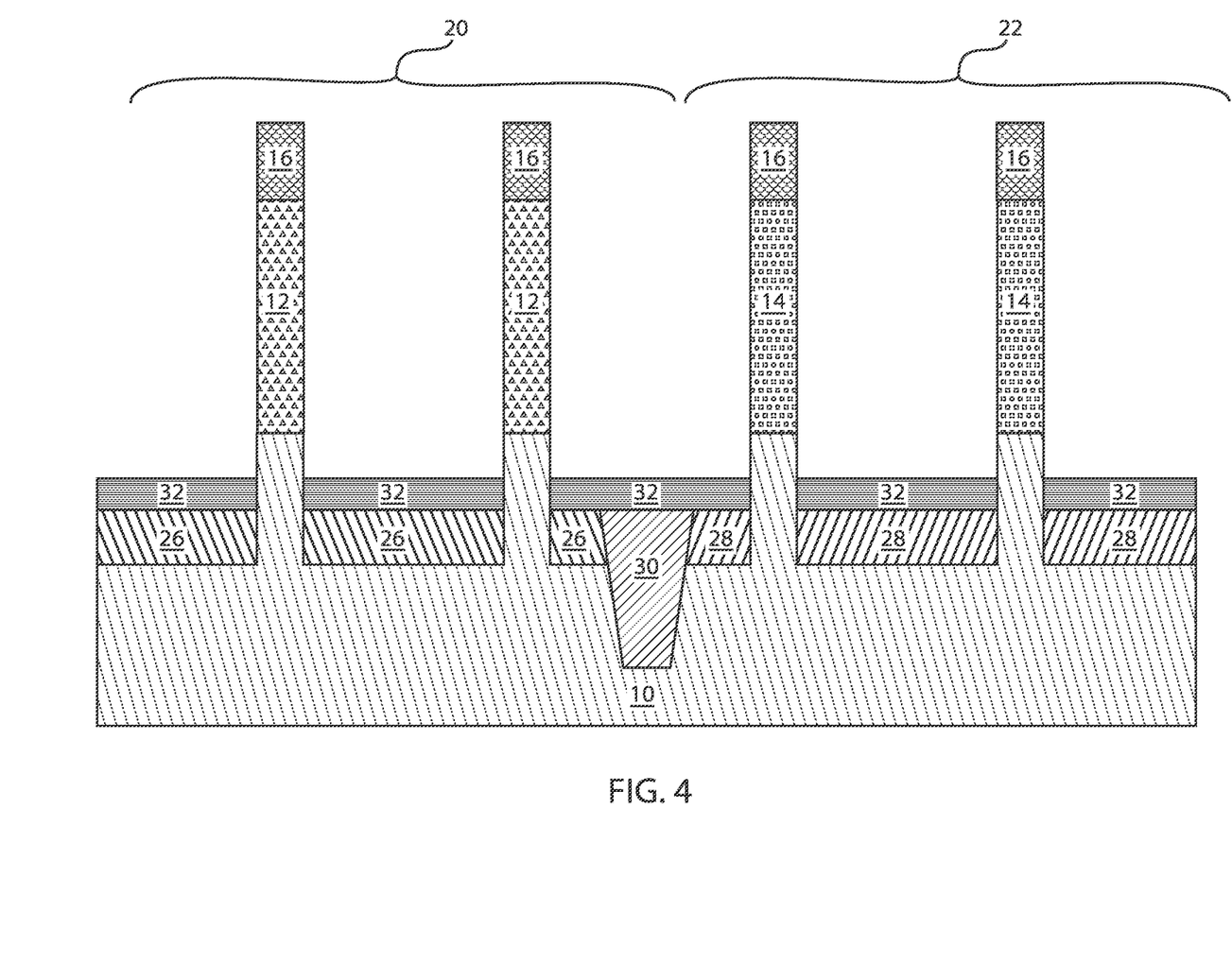
FIG. 4 is a cross-sectional view of the semiconductor structure of FIG. 3 where bottom spacers are formed over the bottom source/drain regions, in accordance with an embodiment of the present invention.

FIG. 4 is a cross-sectional view of the semiconductor structure of FIG. 3 where bottom spacers are formed over the bottom source/drain regions, in accordance with an embodiment of the present invention.

In various exemplary embodiments, bottom spacers 32 can be formed over the bottom source/drain regions 26, 28 in the nFET region 20 and the pFET region 22.

Bottom spacers 32 can include a low-k dielectric formed according to known processes. The term "low-k dielectric" generally refers to an insulating material having a dielectric constant less than silicon dioxide, e.g., less than 3.9. Exemplary low-k dielectric materials include, but are not limited to, dielectric nitrides (e.g., SiN, SiBCN), dielectric oxynitrides (e.g., SiOCN, SiCO), or any combination thereof or the like.

Figure 5:
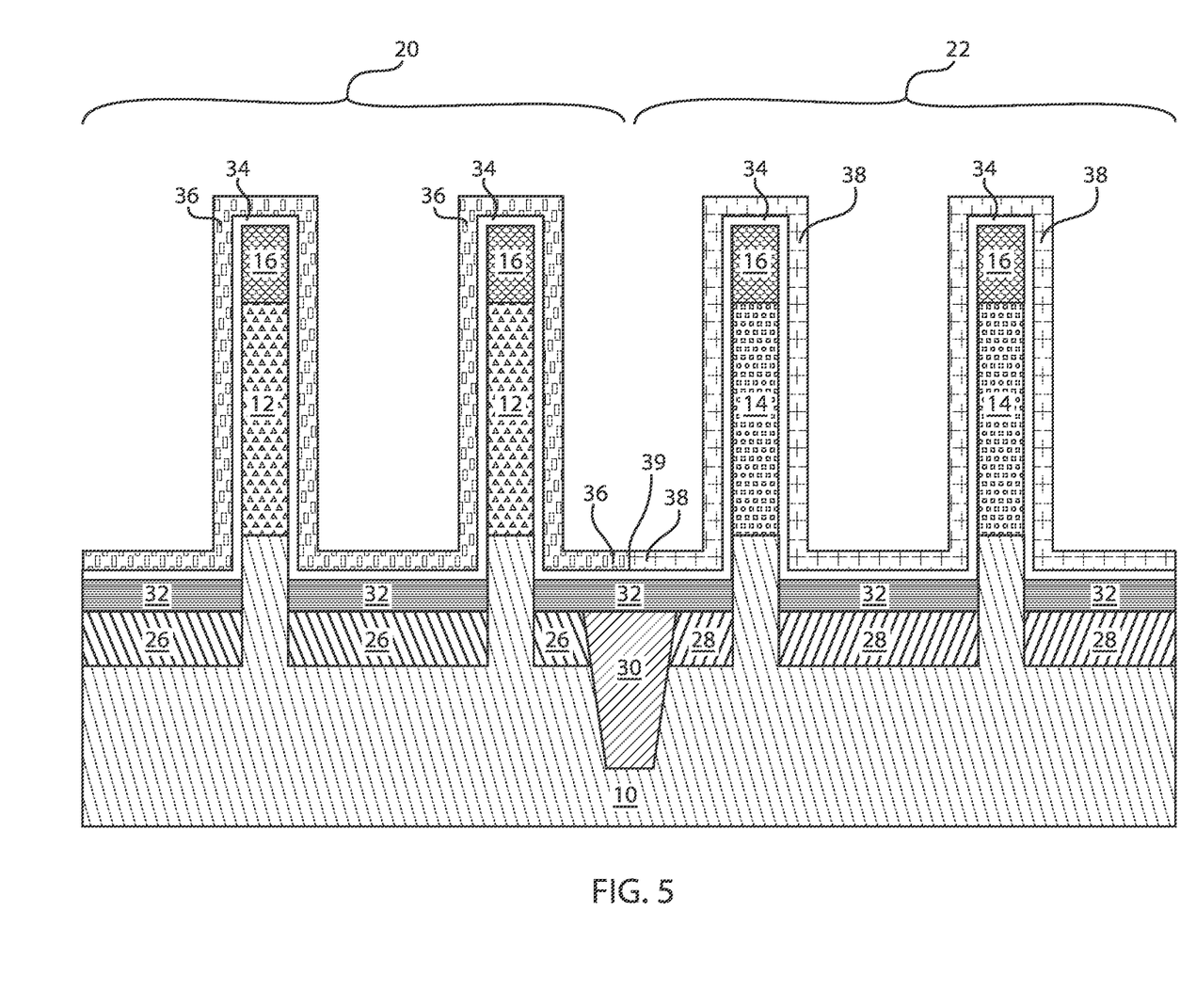
FIG. 5 is a cross-sectional view of the semiconductor structure of FIG. 4 where a high-k metal gate is formed over the plurality of fins, in accordance with an embodiment of the present invention.

FIG. 5 is a cross-sectional view of the semiconductor structure of FIG. 4 where a high-k metal gate is formed over the plurality of fins, in accordance with an embodiment of the present invention.

In various exemplary embodiments, a high-k metal gate is formed over the plurality of fins. The high-k material layer 34 extends over the first set of fins 12 and the second set of fins 14. A metal gate 36 is then formed over the high-k material layer 34 in the nFET region 20 and a metal gate 38 is then formed over the high-k material layer 34 in the pFET region 22. Thus, the metal gate 36 extends to point 39 defined over the STI region 30 and metal gate 38 extends from point 39 over the STI region 30 and into the pFET region 22.

The high-k layer 34 can include a hafnium oxide (HfO$_2$) layer deposited to a thickness of approximately 2 nm. High-k layer 34 can be formed using ALD, which involves the deposition of successive monolayers over a substrate within a deposition chamber usually maintained at sub-atmospheric pressure. Furthermore, it will be appreciated that "high-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, HfO$_2$, ZrO$_2$, Al$_2$O$_3$, TiO$_2$, Ta$_2$O$_5$, lanthanide oxides and mixtures thereof, silicates and materials such as YSZ (yttria-stabilized zirconia), BST, BT, ST, and SBT.

nWFM layer 36 can be selectively grown over high-k layer 34 and can include aluminum (Al) or an aluminum/titanium (Al/Ti) multilayer stack, where the Al/Ti thickness can be tuned for target composition ratio to achieve the desired work function. Both Al and Ti could be selectively grown. In other exemplary embodiments, the nWFM layer 36 can be, e.g., TiN, TiAlC, TaN, etc. In one embodiment, the nWFM layer 36 is a multi-layered stack including TiN/TiAlC/TiN.

pWFM layer 38 can be selectively grown over high-k layer 34 and can include TiN.

Therefore, a high-k material 34 can be formed, followed by formation of work function metal (WFM) layers 36, 38 according to one polarity device (for example nFET or pFET) on the wafer and according to another polarity device (for example nFET or pFET). It is appreciated that an nFET uses one type of WFM and a pFET uses another type of WFM. In one example, the WFM layer 38 can be TiN for a pFET, and the WFM layer 36 can be Al-doped TiN or TaN, or a multi-layered stack including TiN/TiAlC/TiN, for an nFET.

Figure 6:
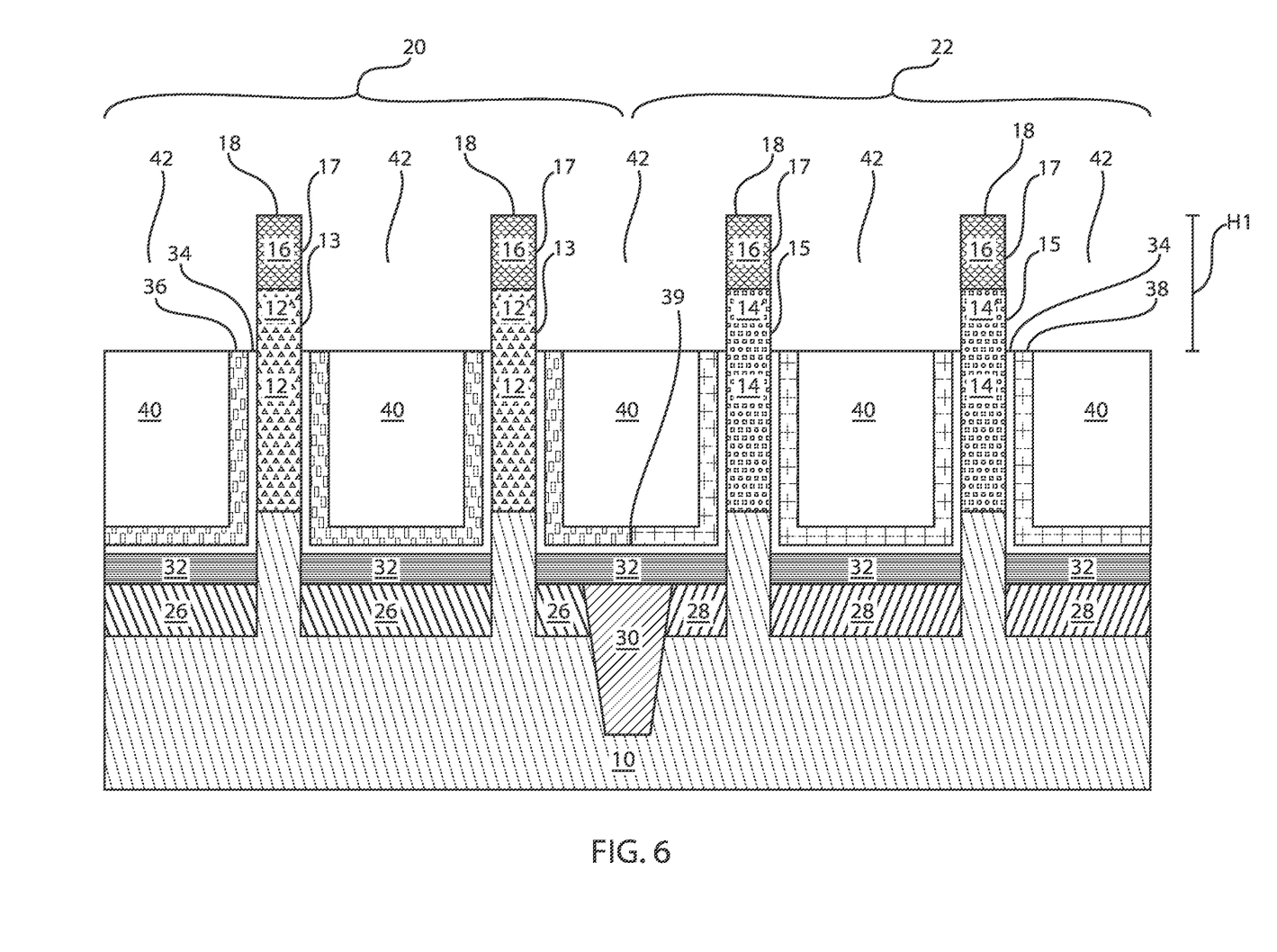
FIG. 6 is a cross-sectional view of the semiconductor structure of FIG. 5 where the high-k metal gate is recessed to expose a top portion of the plurality of fins, in accordance with an embodiment of the present invention.

FIG. 6 is a cross-sectional view of the semiconductor structure of FIG. 5 where the high-k metal gate is recessed to expose a top portion of the plurality of fins, in accordance with an embodiment of the present invention.

In various exemplary embodiments, an organic planarization layer (OPL) 40 is deposited between the first set of fins 12 and the second set of fins 14. Then, the OPL 40 and the high-k metal gates 34, 36 and 34, 38 are recessed to expose top portions 12', 14' of the plurality of fins 12, 14. The recess can extend a distance "H$_1$." The recess further creates openings 42 between the exposed top portions 12', 14' of the plurality of fins 12, 14. The recess exposes sidewalls 13 of top portion 12' of fins 12. The recess further exposes sidewalls 15 of top portions 14' of fins 14. Additionally, the hardmask 16 remains over the plurality of fins 12, 14. The top surface 18 and sidewalls 17 of the hardmask 16 are thus exposed.

Figure 7:
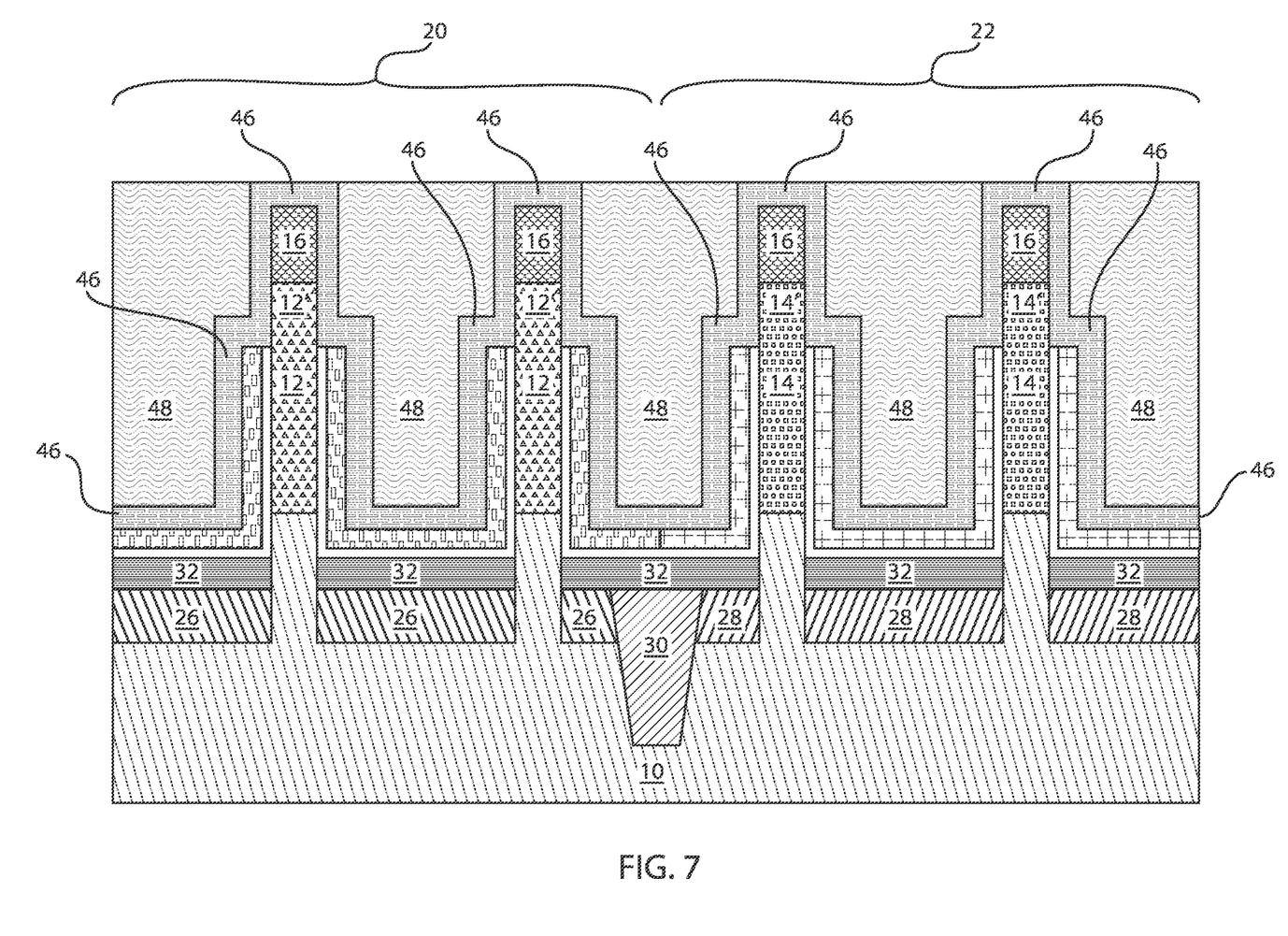
FIG. 7 is a cross-sectional view of the semiconductor structure of FIG. 6 where gate encapsulation takes place, in accordance with an embodiment of the present invention.

FIG. 7 is a cross-sectional view of the semiconductor structure of FIG. 6 where gate encapsulation takes place, in accordance with an embodiment of the present invention.

In various exemplary embodiments, gate encapsulation takes place. Gate encapsulation can include deposition of a first gate encapsulation layer 46 and a second gate encapsulation layer 48. The first gate encapsulation layer 46 can be a nitride, such as, e.g., SiN or SiBCN. The second gate encapsulation layer 48 can be an oxide, such as, e.g., SiO$_2$. The first gate encapsulation layer 46 is deposited over the plurality of fins 12, 14, whereas the second gate encapsulation layer 48 is deposited between the plurality of fins 12, 14.

The second gate encapsulation layer 48 can be planarized. The planarizing process can include chemical mechanical polishing (CMP) followed by an etch process. Thus, the planarization process can be provided by CMP. Other planarization processes can include grinding and polishing.

Figure 8:
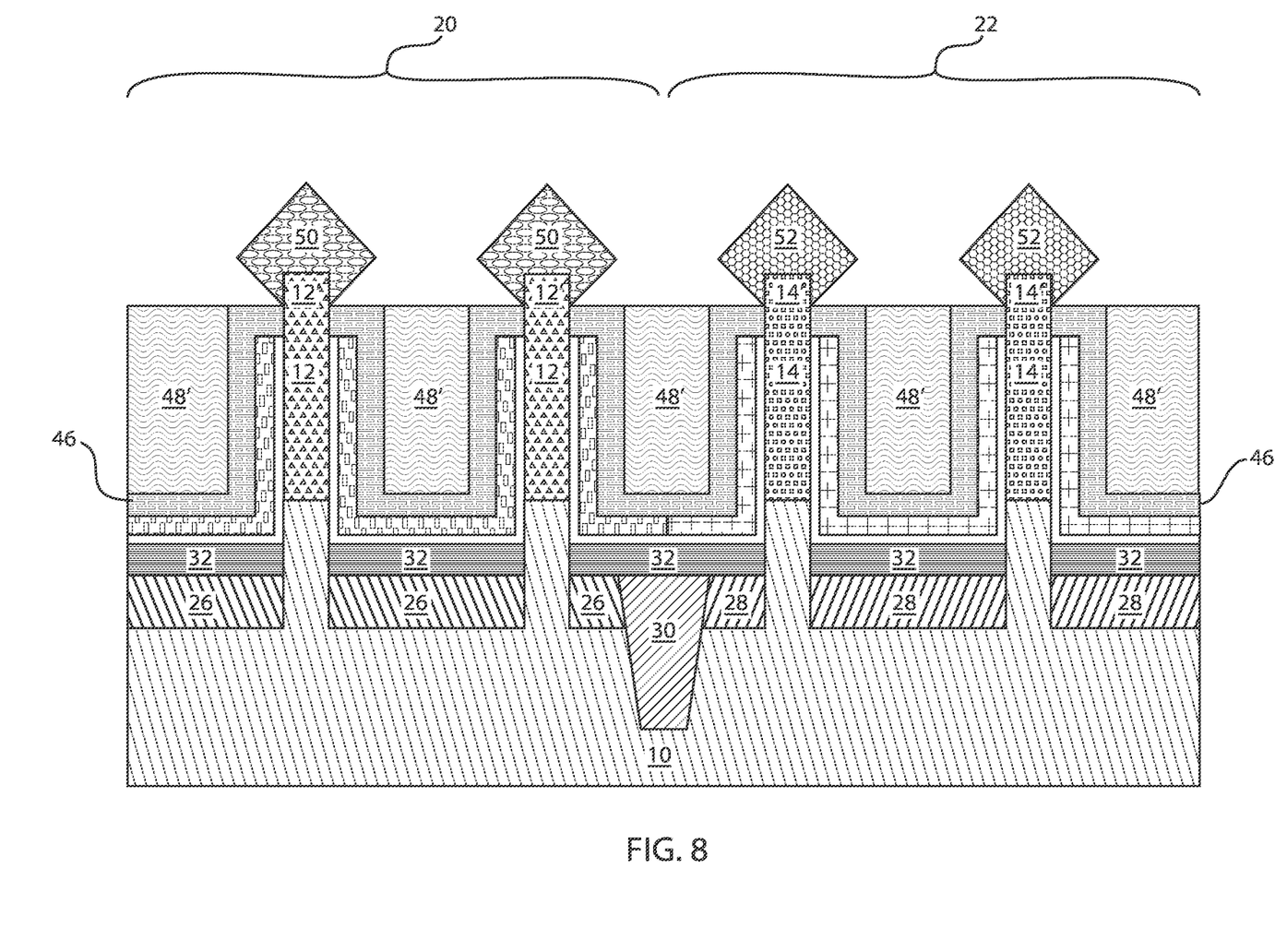
FIG. 8 is a cross-sectional view of the semiconductor structure of FIG. 7 where top source/drain regions are formed over and in direct contact with the exposed top portion of the plurality of fins, in accordance with an embodiment of the present invention.

FIG. 8 is a cross-sectional view of the semiconductor structure of FIG. 7 where top source/drain regions are formed over and in direct contact with the exposed top portion of the plurality of fins, in accordance with an embodiment of the present invention.

In various exemplary embodiments, the first and second gate encapsulation layers 46, 48 are recessed until the top portions 12', 14' of the plurality of fins 12, 14, respectively, are exposed. This results in the removal of the hardmask 26 and having a remaining oxide 48'. The high-k layer 34, the nWFM 36 in the nFET region 20, and pWFM 38 in the pFET region 22 remain intact from the recess of the first and second gate encapsulation layers 46, 48. The top portion of the high-k layer 34, the nWFM 36 in the nFET region 20, and pWFM 38 in the pFET region 22 are protected by a remaining section of the first encapsulation layer 46.

Recessing the layers 46, 48 can be performed by wet etch processing. In one example, a vertical wet etch can be employed to define the channel length. Non-limiting examples of wet etch processes that can be used to form the recess include hydrogen peroxide (H$_2$O$_2$), potassium hydroxide (KOH), ammonium hydroxide (ammonia), tetramethylammonium hydroxide (TMAH), hydrazine, or ethylene diamine pyrocatechol (EDP), or any combination thereof.

Subsequently, top source/drain regions 50 are formed over the exposed top portions 12' of the fins 12 in the nFET region 20 and top source/drain regions 52 are formed over the exposed top portions 14' of the fins 14 in the pFET region 22.

Top source/drain regions 50, 52 can be epitaxially grown. Source/drain regions 50, 52 can be, e.g., Si:P for an nFET (in nFET region 20) and SiGe:B for a pFET (in pFET region 22). Thus, the top source/drain region is different for the Si:C fins 12 compared to the top source/drain region for the SiGe fins 14. It is to be understood that the term "source/drain region" as used herein means that a given source/drain region can be either a source region or a drain region, depending on the application.

Figure 9:
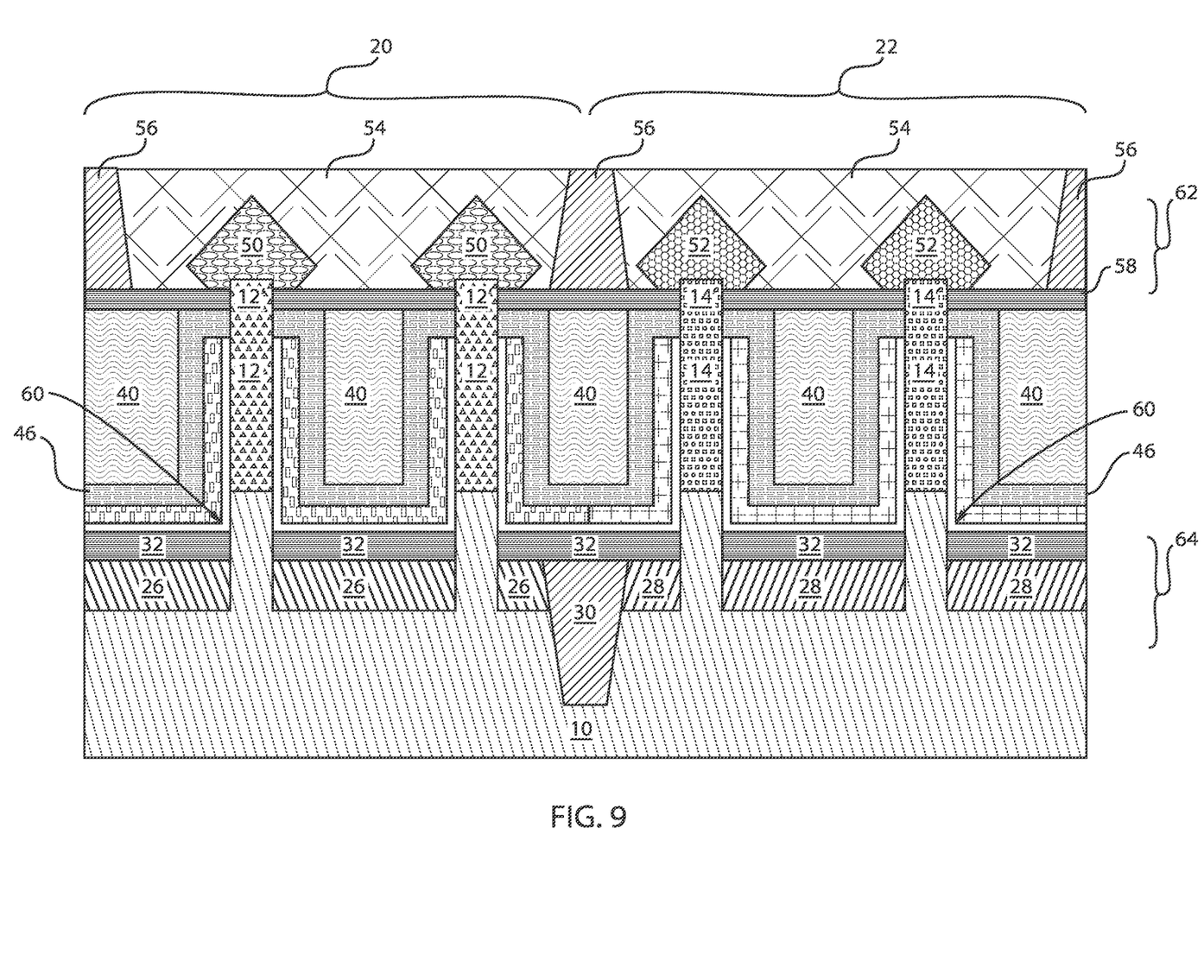
FIG. 9 is a cross-sectional view of the semiconductor structure of FIG. 8 where metallization of the top/source drain regions takes place, in accordance with an embodiment of the present invention.

FIG. 9 is a cross-sectional view of the semiconductor structure of FIG. 8 where metallization of the top/source drain regions takes place, in accordance with an embodiment of the present invention.

In various exemplary embodiments, top spacers 58 are formed. Top spacer material 58 can be formed over the entire structure. To spacers 58 can directly contact a lower region of the top source/drain regions 50, 52. Examples of top spacer material 58 can include oxides and nitrides (such as, e.g., SiN, SiBCN, SiOCN). The top spacer material 58 can be a low-k dielectric material. In one implementation, the top spacer material 58 can be formed with techniques analogous to forming the bottom spacer material 32. The bottom spacer material 32 can be thicker than the top spacer material 58.

In various exemplary embodiments, metallization of the top/source drain regions takes place. The metallization includes forming metal layer 54. The metal layer 54 contacts and encapsulates or encompasses top source/drain regions 50 in the nFET region 20 and top source/drain regions 52 in the pFET region 22. Additionally, contacts 56 can be formed through the metal layer 54. Contacts 56 can be source, drain, gate contacts. Area 62 can be referred to as the drain and area 64 can be referred to as the source. A gradient threshold voltage can be achieved in regions 60 near the source area 64.

In one exemplary embodiment, the metal layer 54 can be, e.g., a titanium/titanium nitride (Ti/TiN) layer or liner. In other exemplary embodiments, the metal layer 54 can be formed from, e.g., Ti, TiN, Ni, etc. The metal layer 54 can be deposited by, e.g., an ALD process. The metal layer 54 can be planarized. The planarizing process can include chemical mechanical polishing (CMP) followed by an etch process. Therefore, the planarization process can be provided by CMP. Other planarization processes can include grinding and polishing.

Consequently, the exemplary embodiments of the present invention have a gradient threshold voltage in the VTFETs, which improves device performance due to the enhancement of the electric field. The gradient threshold voltage of the VTFETs in the exemplary embodiments of the present invention can be achieved by a dual channel configuration. For nFET threshold voltage control, carbon can be employed to decrease the threshold voltage, whereas for the pFET threshold voltage control, germanium can be used in the channel (pFET Vt controlled by Ge concentration in the channel). Thus, asymmetric threshold voltage along the channel can be achieved by channel engineering involving Si:C incorporation for an nFET and SiGe incorporation of a pFET. The asymmetric threshold voltage profile can be seen at area 60 where a steep potential distribution near the source side enhances the lateral channel electric field and thus increases carrier mobility.

Regarding FIGS. 1-9, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming an asymmetric threshold voltage vertical transport field effect transistor (VTFET) with intrinsic dual channel epitaxy (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure for triggering asymmetric threshold voltage along a channel of a vertical transport field effect transistor (VTFET), the semiconductor structure comprising:
   a first set fins constructed from a first material;
   a second set of fins constructed from a second material;
   a first high-k metal gate disposed over the first set of fins; and
   a second high-k metal gate disposed over the second set of fins, such that the asymmetric threshold voltage is present along the channel of the VTFET in a region defined at the bottom of the first and second set of fins.

2. The semiconductor structure of claim 1, wherein a bottom source region is disposed between the first set of fins.

3. The semiconductor structure of claim 2, wherein a bottom drain region is disposed between the second set of fins.

4. The semiconductor structure of claim 3, wherein the bottom source region is composed of a different material than the bottom drain region.

5. The semiconductor structure of claim 4, wherein the second high-k metal gate is different than the first high-k metal gate.

6. The semiconductor structure of claim 5, wherein a shallow trench isolation (STI) region separates the bottom source region from the bottom drain region.

7. The semiconductor structure of claim 6, wherein top source/drain regions are disposed over exposed top portions of the first and second set of fins.

8. The semiconductor structure of claim 7, wherein a metal fill is disposed over the top source/drain regions.

9. The semiconductor structure of claim 8, wherein a bottom spacer is disposed between the first high-k metal gate and the bottom source and drain regions.

10. The semiconductor structure of claim 1, wherein the first material is carbon doped silicon (Si:C) and the second material is silicon germanium (SiGe).

11. A semiconductor structure for triggering asymmetric threshold voltage along a channel of a vertical transport field effect transistor (VTFET), the semiconductor structure comprising:
    a plurality of carbon doped silicon (Si:C) fins disposed over a substrate;
    a plurality of silicon germanium (SiGe) fins disposed over the substrate;
    a first high-k metal gate disposed over the plurality of Si:C fins; and
    a second high-k metal gate disposed over the plurality of SiGe fins such that the asymmetric threshold voltage is present along the channel of the VTFET.

12. The semiconductor structure of claim 11, wherein a silicon doped with phosphorous (Si:P) source region is disposed between the plurality of Si:C fins.

13. The semiconductor structure of claim 12, wherein a silicon germanium doped with boron (SiGe:B) drain region is disposed between the plurality of SiGe fins.

14. The semiconductor structure of claim 13, wherein a shallow trench isolation (STI) region separates the Si:P source region from the SiGe:B drain region.

15. The semiconductor structure of claim 14, wherein the channel of the VTFET is disposed in a region defined at the bottom of the plurality of Si:C fins and at the bottom of the plurality of SiGe fins.

16. The semiconductor structure of claim 15, wherein top source/drain regions are disposed over exposed top portions of the plurality of Si:C fins and the plurality of SiGe fins.

17. The semiconductor structure of claim 16, wherein a metal fill is disposed over the top source/drain regions.

18. The semiconductor structure of claim 17, wherein a metal gate of the first high-k metal gate is a multi-layered stack including titanium nitride/titanium aluminum carbide/titanium nitride (TiN/TiAlC/TiN) and a metal gate of the second high-k metal gate is titanium nitride (TiN).

19. The semiconductor structure of claim 18, wherein a bottom spacer is disposed between the first high-k metal gate and the Si:P source region and the SiGe:B drain region.

20. The semiconductor structure of claim 11, wherein a gate encapsulation layer directly contacts a portion of a top section of the plurality of Si:C fins and of the plurality of SiGe fins.

* * * * *